(12) United States Patent
Kanda

(10) Patent No.: US 10,225,068 B2
(45) Date of Patent: Mar. 5, 2019

(54) CLOCK RECOVERY CIRCUIT, SEMICONDUCTOR INTEGRATED CIRCUIT DEVICE AND RADIO FREQUENCY TAG

(71) Applicant: FUJITSU LIMITED, Kawasaki-shi, Kanagawa (JP)

(72) Inventor: Kouichi Kanda, Chofu (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/723,642

(22) Filed: Oct. 3, 2017

(65) Prior Publication Data
US 2018/0123774 A1    May 3, 2018

(30) Foreign Application Priority Data
Oct. 28, 2016    (JP) .................................. 2016-211485

(51) Int. Cl.
| | |
|---|---|
| *G07C 9/00* | (2006.01) |
| *G06K 7/10* | (2006.01) |
| *H03H 11/16* | (2006.01) |
| *H04L 7/00* | (2006.01) |
| *H04W 4/80* | (2018.01) |
| *H03L 7/18* | (2006.01) |
| *H04B 10/114* | (2013.01) |
| *H03L 7/08* | (2006.01) |
| *G06K 19/07* | (2006.01) |

(Continued)

(52) U.S. Cl.
CPC ........ *H04L 7/0025* (2013.01); *G06K 7/10366* (2013.01); *G06K 19/0723* (2013.01); *H03H 11/16* (2013.01); *H03L 7/0807* (2013.01); *H04B 10/1143* (2013.01); *H04L 7/00* (2013.01); *H03L 7/0891* (2013.01); *H03L 7/18* (2013.01); *H04L 7/0331* (2013.01); *H04W 4/80* (2018.02)

(58) Field of Classification Search
CPC .. H04L 27/06; H04L 7/00; H03L 7/00; H03H 11/16
USPC ....... 340/10.1–10.5; 375/340, 355, 371, 372, 375/359, 138, 171; 235/376; 327/138, 327/171
See application file for complete search history.

(56) References Cited

U.S. PATENT DOCUMENTS

| | | | |
|---|---|---|---|
| 6,278,755 B1 | 8/2001 | Baba et al. | |
| 6,844,765 B2 * | 1/2005 | Sasaki | G06F 1/06 327/258 |
| 6,970,521 B2 * | 11/2005 | Dosho | H04L 7/0338 327/291 |

(Continued)

FOREIGN PATENT DOCUMENTS

| | | |
|---|---|---|
| JP | 2000-332736 | 11/2000 |
| JP | 2001-186112 | 7/2001 |

(Continued)

*Primary Examiner* — Nam V Nguyen
(74) *Attorney, Agent, or Firm* — Fujitsu Patent Center

(57) ABSTRACT

A clock recovery circuit includes: a multi-phase clock generating circuit configured to generate multi-phase clocks having different phases; a plurality of switch elements configured to control coupling between each of the multi-phase clocks and an output node; and a switch control circuit configured to compare phases of the multi-phase clocks and input data and control, to an on-state, at least two switch elements of the plurality of switch elements corresponding to at least two clocks whose phase difference falls within a given range, wherein the at least two clocks selected through the at least two switch elements controlled to the on-state are subjected to phase interpolation to recover an output clock.

16 Claims, 17 Drawing Sheets

(51) Int. Cl.
    *H03L 7/089*    (2006.01)
    *H04L 7/033*    (2006.01)

(56) References Cited

U.S. PATENT DOCUMENTS

| | | | | |
|---|---|---|---|---|
| 7,599,457 | B2 * | 10/2009 | Johnson | H04L 7/0338 |
| | | | | 326/93 |
| 7,684,531 | B2 * | 3/2010 | Masui | H04L 7/0338 |
| | | | | 375/355 |
| 7,912,167 | B2 * | 3/2011 | Saeki | H03L 7/0814 |
| | | | | 375/326 |
| 8,170,168 | B2 * | 5/2012 | Oshima | H04L 7/033 |
| | | | | 375/355 |
| 8,844,765 | B2 * | 9/2014 | Tryon | B05B 1/02 |
| | | | | 222/1 |
| 8,886,047 | B2 * | 11/2014 | Knapp | H04B 10/807 |
| | | | | 398/138 |
| 9,160,345 | B1 * | 10/2015 | Gorecki | H03K 5/135 |
| 9,584,304 | B2 * | 2/2017 | Chien | H04L 7/0025 |
| 9,853,606 | B2 * | 12/2017 | Kanda | H03F 1/12 |
| 2001/0005156 | A1 | 6/2001 | Dosho | |
| 2003/0214335 | A1 | 11/2003 | Saeki | |
| 2004/0169539 | A1 * | 9/2004 | Gauthier | H03K 5/135 |
| | | | | 327/231 |
| 2010/0065625 | A1 * | 3/2010 | Sabeta | G06K 19/077 |
| | | | | 235/376 |
| 2014/0266457 | A1 * | 9/2014 | Scott | H03F 3/195 |
| | | | | 330/291 |
| 2015/0055726 | A1 * | 2/2015 | Yamaji | H03B 19/14 |
| | | | | 375/295 |
| 2018/0109247 | A1 * | 4/2018 | Yang | H03K 5/135 |

FOREIGN PATENT DOCUMENTS

| | | |
|---|---|---|
| JP | 2003-333021 | 11/2003 |
| JP | 2010-200220 | 9/2010 |

\* cited by examiner

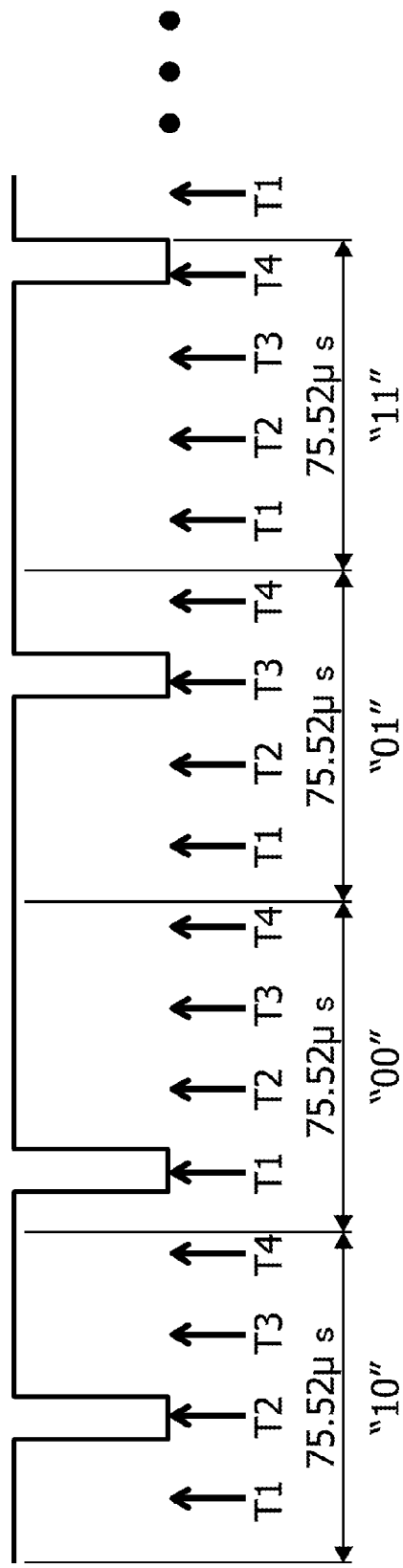

CLOCK RECOVERY CIRCUIT, SEMICONDUCTOR INTEGRATED CIRCUIT DEVICE AND RADIO FREQUENCY TAG

CROSS-REFERENCE TO RELATED APPLICATION

This application is based upon and claims the benefit of priority of the prior Japanese Patent Application No. 2016-211485, filed on Oct. 28, 2016, the entire contents of which are incorporated herein by reference.

FIELD

The embodiment discussed herein is related to a clock recovery circuit, a semiconductor integrated circuit device, and a radio frequency (RF) tag.

BACKGROUND

An organic semiconductor field effect transistor (FET) that operates with low power consumption may be applied to a radio frequency identification (RFID), for example. In the RFID, data of an RF tag may be read and written in a contactless manner by using radio waves. The RFID (RF tag) may be desired to have an operating speed of about 20 to 100 kb/second based on standards such as International Organization for Standardization (ISO) 14443 and ISO 15693.

Examples of the related art include Japanese Laid-open Patent Publication No. 2003-333021, No. 2010-200220, No. 2001-186112, or No. 2000-332736.

SUMMARY

According to an aspect of the embodiment, a clock recovery circuit includes: a multi-phase clock generating circuit configured to generate multi-phase clocks having different phases; a plurality of switch elements configured to control coupling between each of the multi-phase clocks and an output node; and a switch control circuit configured to compare phases of the multi-phase clocks and input data and control, to an on-state, at least two switch elements of the plurality of switch elements corresponding to at least two clocks whose phase difference falls within a given range, wherein the at least two clocks selected through the at least two switch elements controlled to the on-state are subjected to phase interpolation to recover an output clock.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 6 illustrates a coding system in ISO 15693.

DESCRIPTION OF EMBODIMENT

For example, an RF tag to which a silicon semiconductor is applied receives a signal of 13.56 MHz sent from a reader (reader-writer) and divides the signal to recover (generate) a clock of a given frequency. For example, in ISO 15693, a carrier wave of 13.56 MHz from a reader is subjected to 1/512 frequency division and a clock of 26 KHz is generated. In ISO 14443, a carrier wave of 13.56 MHz from a reader is subjected to 1/128 frequency division and a clock of 106 KHz is generated. Each clock is used as a clock at the symbol rate.

For example, in an RF tag to which an organic semiconductor is applied, the operating frequency of an oscillator is on the order of hundred KHz, for example, and it might be difficult to divide the frequency of a carrier wave of 13.56 MHz from a reader and generate a clock at the symbol rate.

For example, a clock recovery circuit (clock data recovery (CDR) circuit) applied to various RF tags and so forth is provided.

For example, in an RF tag to which an organic semiconductor is applied, it might be difficult to divide the frequency of a signal sent from a reader and generate a clock at the symbol rate compared with an RF tag to which a silicon semiconductor is applied.

For example, in a clock recovery circuit (CDR), a clock is generated based on a phase-locked loop (PLL). In this case, a voltage-controlled oscillator (VCO) is used. However, variation is large with the organic semiconductor and therefore the generated (recovered) clock might not be locked to a desired frequency.

For example, clock recovery circuits, semiconductor integrated circuit devices, and RF tags to be represented below are not limited to clock recovery circuits, semiconductor integrated circuit devices, and RF tags to which an organic semiconductor is applied and may be clock recovery circuits, semiconductor integrated circuit devices, and RF tags to which various semiconductors such as silicon semiconductors and compound semiconductors are applied.

Figure 1:
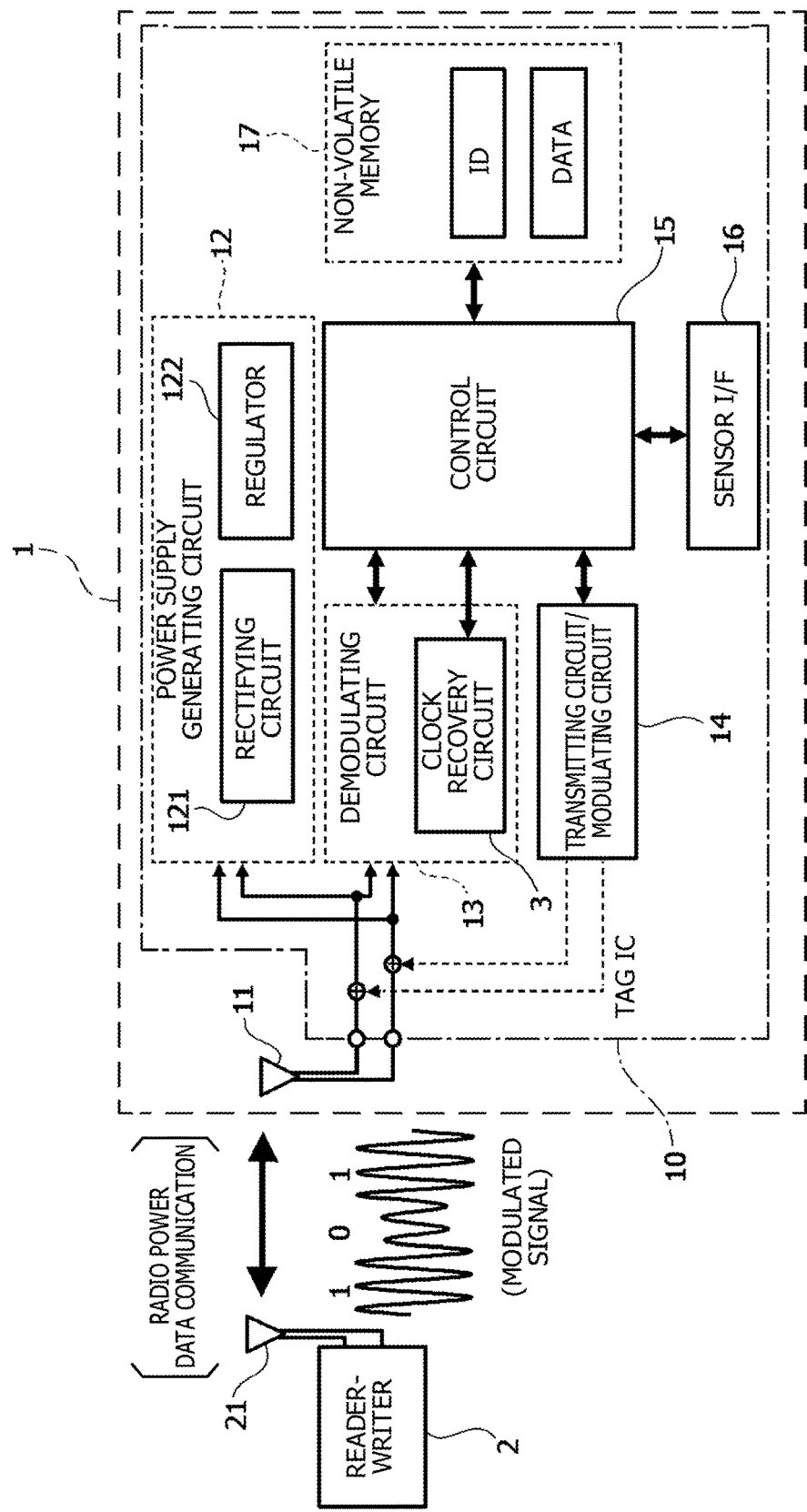
FIG. 1 illustrates one example of an RFID.

FIG. 1 illustrates one example of an RFID.

As illustrated in FIG. 1, an RFID system includes an RF tag 1 and a reader-writer (reader) 2. The RF tag 1 includes a tag integrated circuit (IC) (semiconductor integrated circuit device) 10 and an antenna 11. The tag IC 10 receives power from the reader 2 by radio and exchanges data with the reader (reader-writer) 2, for example, through the antenna 11 provided in the RF tag 1 and an antenna 21 provided in the reader 2.

The tag IC 10 includes a power supply generating circuit 12, a demodulating circuit 13, a transmitting circuit/modulating circuit 14, a control circuit 15, a sensor interface (sensor I/F) 16, and a non-volatile memory 17, for example. The power supply generating circuit 12 includes a rectifying circuit 121 and a regulator 122. For example, the power supply generating circuit 12 generates power from a signal of the reader 2 (antenna 21) received through the antenna 11 and supplies the power to the respective circuits of the tag IC 10.

The demodulating circuit 13 includes a clock recovery circuit (CDR circuit) 3. The demodulating circuit 13 recovers (generates) a clock based on the signal of the reader 2 received through the antenna 11 and carries out demodulation of data and so forth by using the generated clock. The clock recovery circuit is not limited to the clock recovery circuit provided in the demodulating circuit 13 of the tag IC 10 in the RFID system illustrated in FIG. 1.

The transmitting circuit/modulating circuit 14 modulates data from the RF tag 1 (tag IC 10) and transmits the data from the antenna 11. For example, the data and identification (ID) to be transmitted from the RF tag 1 are stored in the non-volatile memory 17 such as a flash electrically erasable programmable read-only memory (EEPROM). The sensor I/F 16 receives data from a sensor such as a temperature sensor. For example, the sensor I/F 16 receives data from various sensors according to the use purpose of the RFID system.

For example, the control circuit 15 controls the demodulating circuit 13, the transmitting circuit/modulating circuit 14, the sensor I/F 16, the non-volatile memory 17, and so forth and carries out control desired for the RFID system to exchange data with the reader 2 through the antenna 11 (21).

A clock used in the control circuit 15, the transmitting circuit/modulating circuit 14, the sensor I/F 16, the non-volatile memory 17, and so forth is generated by the clock recovery circuit 3 provided in the demodulating circuit 13. For example, a clock at the symbol rate is generated in order to for the RF tag 1 to receive the signal from the reader 2.

Figure 2:
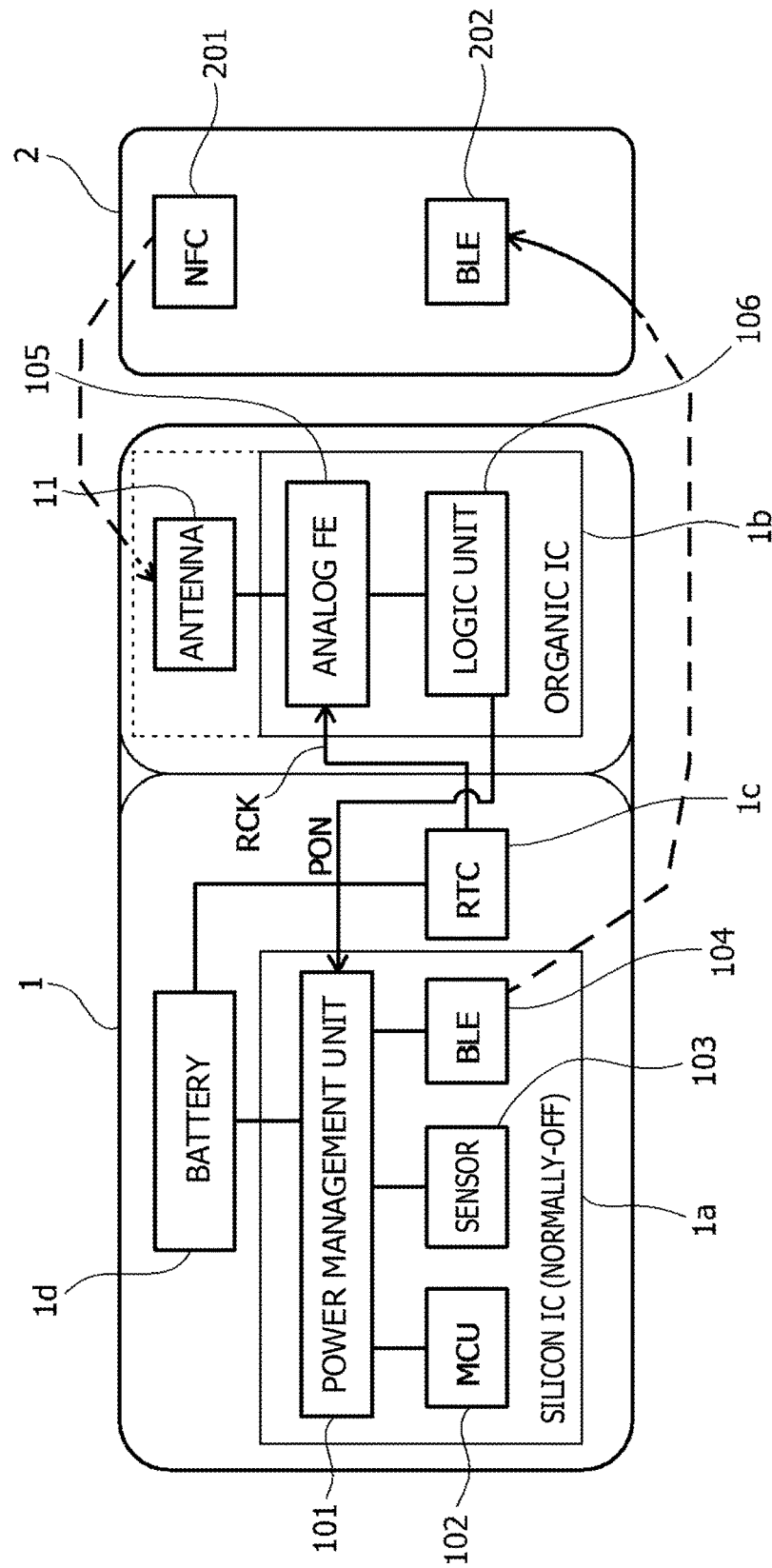
FIG. 2 illustrates one example of an RF tag.

FIG. 2 illustrates one example of an RF tag. As illustrated in FIG. 2, the RF tag 1 includes a sensor main body circuit unit 1a, a short-distance radio communication circuit unit 1b, a real-time clock generating circuit (RTC) 1c, and a battery 1d.

The sensor main body circuit unit 1a may be formed of a silicon semiconductor integrated circuit (silicon IC) including silicon transistors, for example. The short-distance radio communication circuit unit 1b may be formed of an organic semiconductor integrated circuit (organic IC) including organic transistors, for example. The sensor main body circuit unit 1a and the real-time clock generating circuit 1c operate by receiving supply of power of the battery 1d. The real-time clock generating circuit 1c is supplied with the power of the battery 1d steadily (also when the real-time clock generating circuit 1c does not operate), for example, and a real-time clock RCK is generated. The sensor main body circuit unit 1a is normally in the off-state (normally-off). For example, the sensor main body circuit unit 1a is supplied with the power of the battery 1d and becomes the operating state after a power-on signal PON from the short-distance radio communication circuit unit 1b is input.

For example, in the RF tag 1 of FIG. 2, the real-time clock generating circuit 1c steadily receives supply of power from the battery 1d to be driven and outputs the generated real-time clock RCK to an analog FE 105 of the short-distance radio communication circuit unit 1b. The frequency of the real-time clock RCK that is available may be 32.8 KHz, for example. The power consumption of the real-time clock generating circuit 1c that is steadily driven is low power on the order of nanowatts (nW), for example.

The sensor main body circuit unit 1a includes a power management unit 101, a microcontroller unit (MCU) 102, a sensor 103, and a BLE control unit (BLE: Bluetooth (registered trademark) Low Energy (registered trademark)) 104. The short-distance radio communication circuit unit 1b includes the analog front-end (analog FE) 105 and a logic unit 106. The reader 2 includes a short-distance radio communication circuit unit (Near Field Communication (NFC)) 201 and a BLE control unit (BLE) 202.

The reader 2 may be a smartphone or the like, for example. The RF tag 1 is stuck to a human body to measure the body temperature and the pulse or is stuck to a baggage to be transported to measure the temperature and so forth at the time of transportation, for example. A given identification (ID) is stored in the RF tag 1. For example, after the given ID of the RF tag 1 is checked by the smartphone (reader) 2, the reader 2 acquires data of the body temperature and pulse of a human body or change in the temperature and humidity of a baggage at the time of transportation, stored in the RF tag 1, for example. The data (data of the body temperature of a human body or the like) of the RF tag 1 (sensor main body circuit unit 1a) to be acquired by the reader 2 is transmitted by radio from the BLE 104 of the sensor main body circuit unit 1a to the BLE 202 of the reader 2.

The short-distance radio communication circuit unit (organic IC) 1b and the antenna 11 are manufactured by low-cost printing, for example and therefore may be discarded every time being used (disposable). In contrast, the silicon semiconductor integrated circuit 1a, the real-time clock generating circuit 1c, and the battery id are expensive and therefore may be repeatedly reused plural times. The application of the RF tag 1 is one example and is not limited to an RF tag for being stuck to a human body or a baggage to acquire the body temperature or temperature change.

Figure 3:
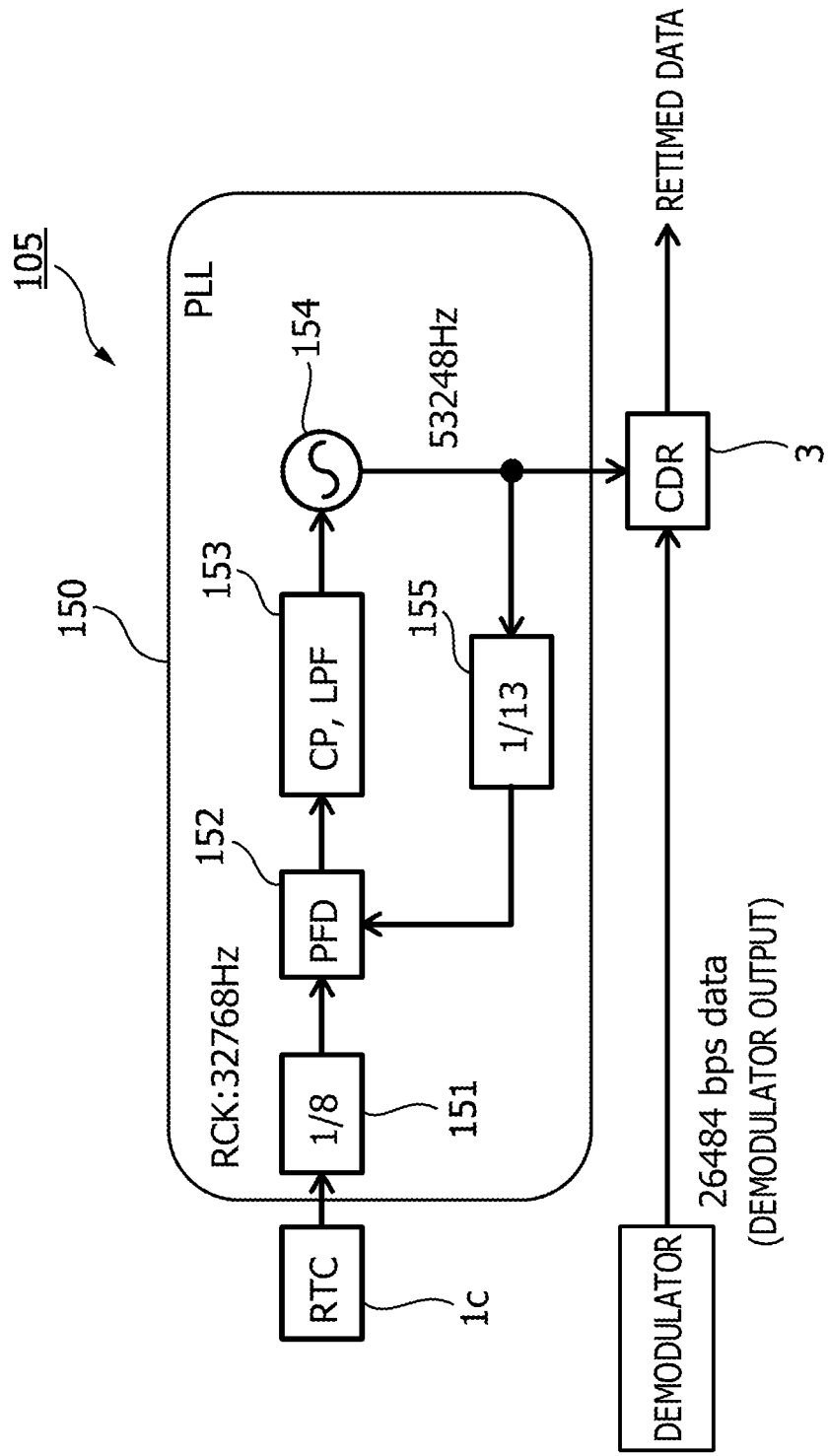
FIG. 3 illustrates one example of an analog FE.

FIG. 3 illustrates one example of an analog FE. The analog FE illustrated in FIG. 3 may be the analog FE 105 illustrated in FIG. 2. As illustrated in FIG. 3, the analog FE (analog front-end) 105 includes a PLL circuit (PLL) 150, a demodulator 156, and a clock data recovery circuit (CDR: clock recovery circuit) 3. For example, the PLL circuit 150 includes a 1/8 frequency divider 151, a phase frequency detector (PFD) 152, charge pump and low-pass filter (CP, LPF) 153, a voltage-controlled oscillator (VCO) 154, and a 1/13 frequency divider 155. For example, the real-time clock RCK of 32768 Hz from the real-time clock generating circuit (RTC) 1c is multiplied by 13/8 and a signal of 53248 Hz (53.248 KHz) is output.

The demodulator 156 outputs data of 26484 bps. In the ISO 15693 standard, a clock of 13.56 MHz/256=52.96875 KHz is desired. In the ISO 14443 standard, a clock of 13.56 MHz/64=211.875 KHz is desired. For example, 53.248 KHz of the output clock of the PLL circuit 150 is a frequency close to 52.96875 KHz desired in the ISO 15693 standard. Furthermore, 212.992 KHz, which is four times the frequency of the output clock of the PLL circuit 150, is a frequency close to 211.875 KHz desired in the ISO 14443 standard.

As above, 53.248 KHz of the output clock of the PLL circuit 150 has a frequency error of about 0.5% with respect to the data rate of the data output by the demodulator 156, for example. For this reason, for example, assuming that the error is 0.5%, a phase shift corresponding to one cycle occurs per 200 times of clock. This phase shift has a length equivalent to a command in the NFC communication (short-distance radio communication), for example. Therefore, if the output clock is used as it is, a bit error due to a timing deviation might occur in reception of the command.

Figure 4:
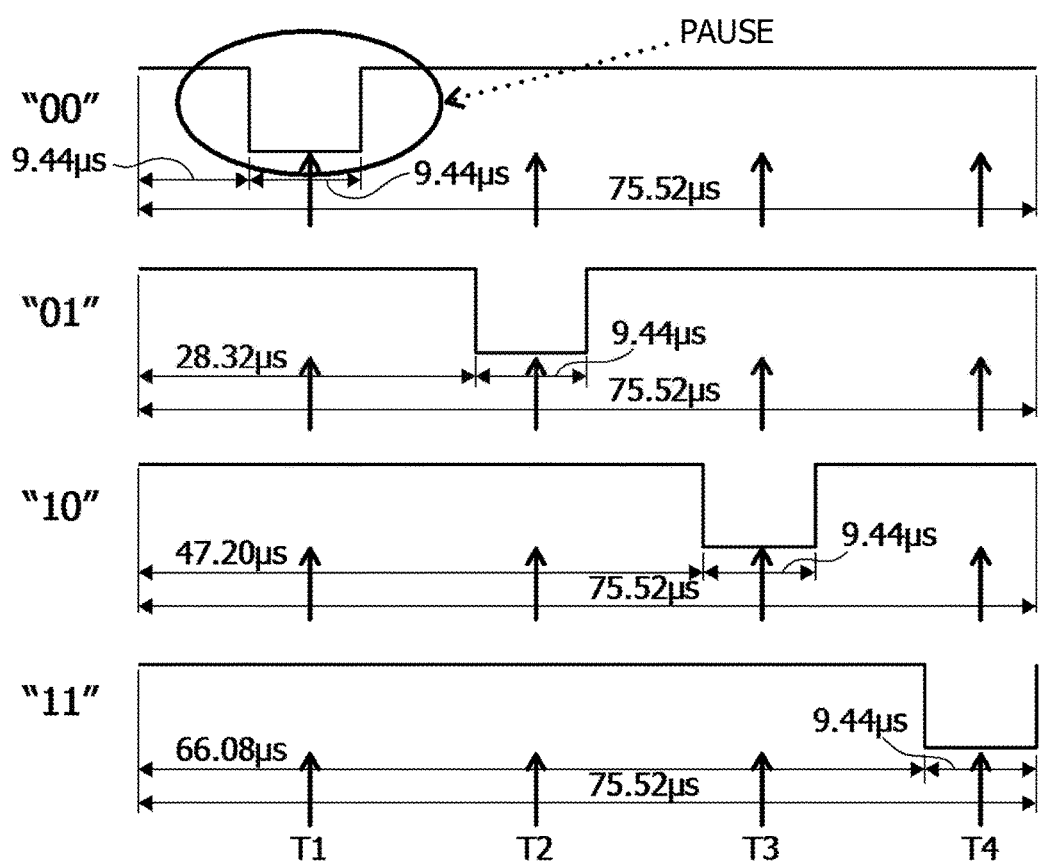
FIG. 4 illustrates a coding system in ISO 15693.
Figure 5A:
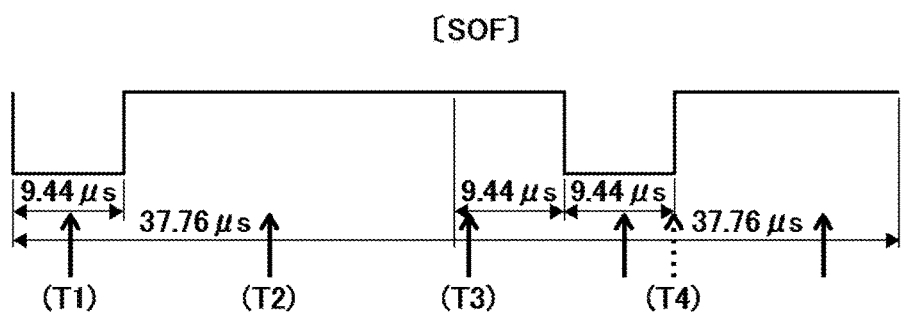
FIG. 5A and FIG. 5B illustrate a coding system in ISO 15693.
Figure 5B:
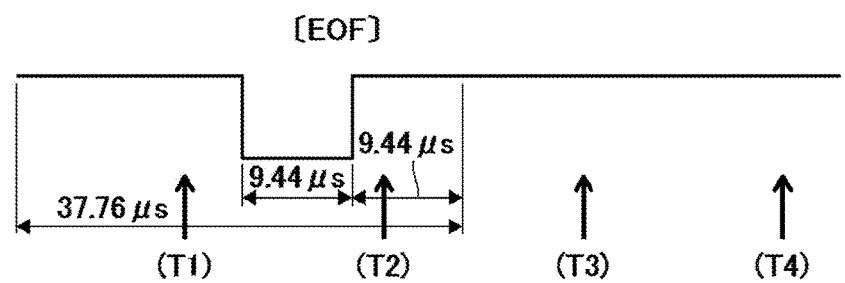

FIGS. 4 to 6 illustrate a coding system in ISO 15693. In FIG. 4, pulse position modulation (PPM) in ISO 15693 will be described. FIG. 5A illustrates the start of frame (SOF) in ISO 15693 and FIG. 5B illustrates the end of frame (EOF) in ISO 15693. FIG. 6 illustrates one example of a command signal in ISO 15693.

As illustrated in FIG. 4, the coding system in ISO 15693 is the prediction by partial matching (PPM) system and four kinds of data, "00," "01," "10," and "11," are represented based on the position at which a pause (low level "0" only in a 1/8 period (9.44 microseconds) of one cycle (75.52 microseconds)) appears. Thus, the data is checked if whether or not the pause ("0") exists is determined at four timings T1 to T4 in FIG. 4. For example, the SOF illustrated in FIG. 5A and the EOF illustrated in FIG. 5B may be exceptions and only one pause in one cycle might not necessarily appear at any of the timings T1 to T4 in FIG. 4.

As illustrated in FIG. 6, by determining the one example of a command signal in ISO 15693 at the timings T1 to T4 represented in FIG. 4, it is checked that the data of the command signal is "00," "01," "10," "11," . . . , for example.

Figure 7:
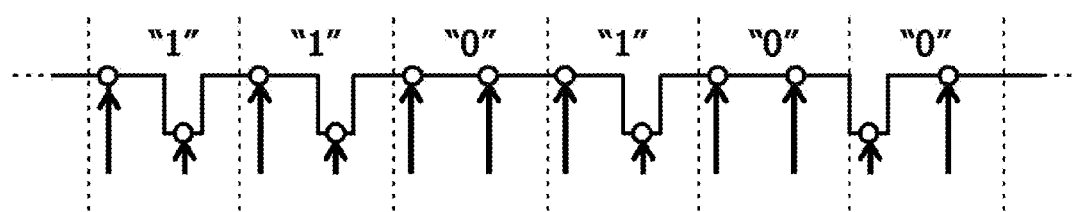
FIG. 7 illustrates a coding system in ISO 14443A.

FIG. 7 illustrates a coding system in ISO 14443A. In FIG. 7, for example, three sequences are illustrated (sequence X: pause is made after the half bit duration, sequence Y: full bit duration non-modulation state, sequence Z: pause is made at the beginning of the bit duration). Logical values "0" and "1" are represented by these sequences X, Y, and Z. As above, the coding system is not limited to the coding system based on ISO 15693 and other various coding systems such as ISO 14443A (ISO 14443) may be applied.

Figure 8:
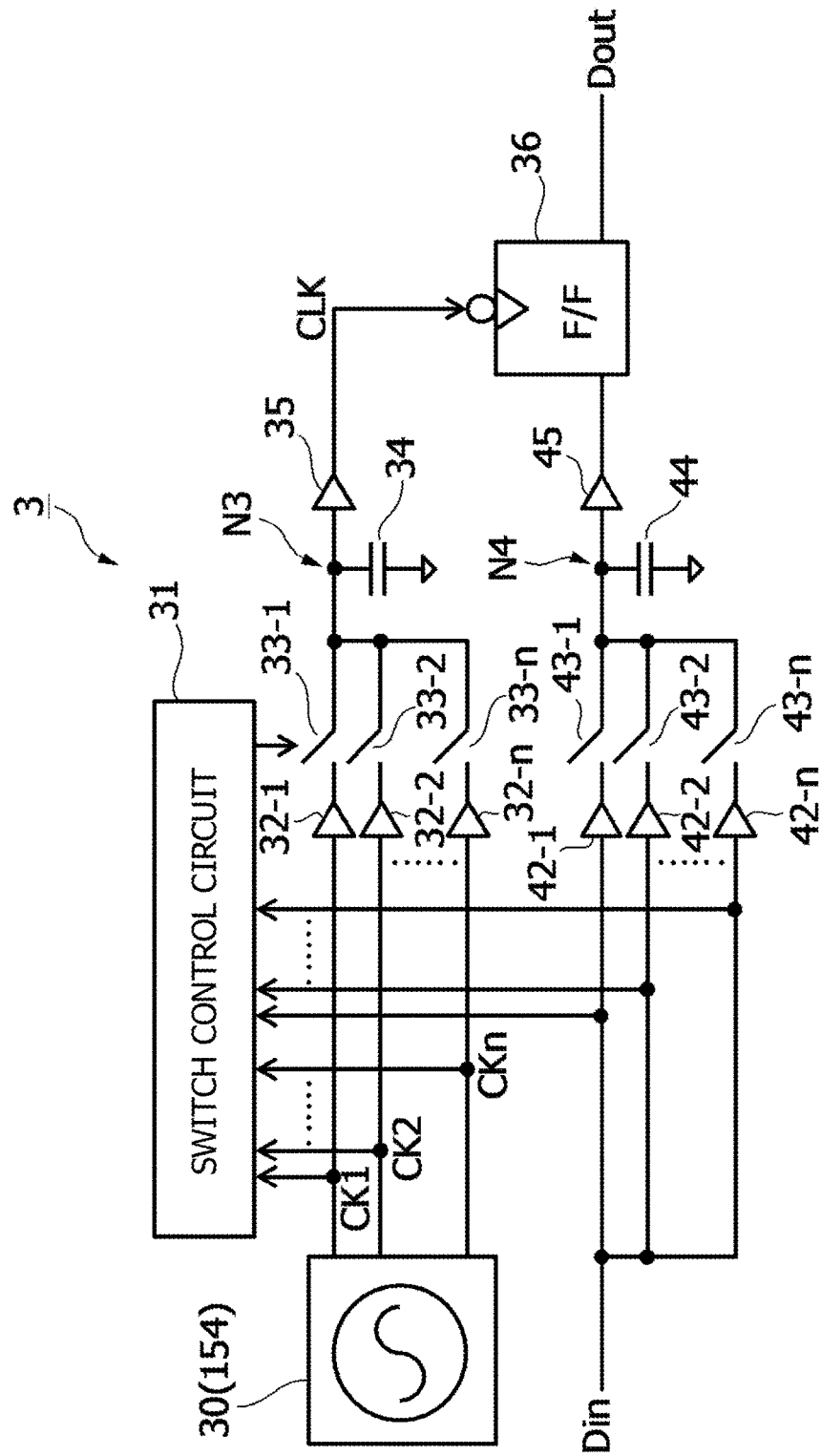
FIG. 8 illustrates one example of a clock recovery circuit.

FIG. 8 illustrates one example of a clock recovery circuit. The clock recovery circuit illustrated in FIG. 8 may be the clock recovery circuit 3 illustrated in FIG. 3. As illustrated in FIG. 8, the clock recovery circuit (CDR circuit) 3 includes buffers 32-1 to 32-n that receive n-phase clocks CK1 to CKn from a multi-phase clock generating circuit 30 and switch elements 33-1 to 33-n. The clock recovery circuit 3 includes a switch control circuit 31 that controls the coupling (on/off) of the switch elements 33-1 to 33-n, a capacitive element 34 coupled to an output node N3 of a recovered clock (output clock) CLK, a buffer 35, and a flip-flop 36.

The switch control circuit (phase comparison) 31 compares the phases of the n-phase clocks CK1 to CKn from the multi-phase clock generating circuit 30 and input data Din and controls the coupling of the corresponding switch elements 33-1 to 33-n based on the comparison result. For example, the number of phases of the clocks CK1 to CKn is set to a sufficiently-large value and the plural switch elements 33-1 to 33-n are simultaneously turned on. Plural clocks having different phases that have passed through the switch elements in the on-state are subjected to phase interpolation (interpolated) by the capacitive element 34.

The buffer 35 carries out waveform shaping for the recovered clock, for example. The clock recovery circuit 3 is provided in the organic semiconductor integrated circuit (short-distance radio communication circuit unit) 1b as described with FIG. 2. As the switch elements 33-1 to 33-n, p-type organic transistors are applied, for example. For example, the multi-phase clock generating circuit 30 may correspond to the voltage-controlled oscillator (VCO) 154 illustrated in FIG. 3.

As illustrated in FIG. 8, in the clock recovery circuit 3, also for the input data Din, dummy buffers 42-1 to 42-n and 45, dummy switch elements 43-1 to 43-n, and a dummy capacitive element 44 are provided in order to replicate delay due to the buffer and so forth in the clock. The buffer 45 for waveform shaping is provided also for the input data Din.

Figure 9:
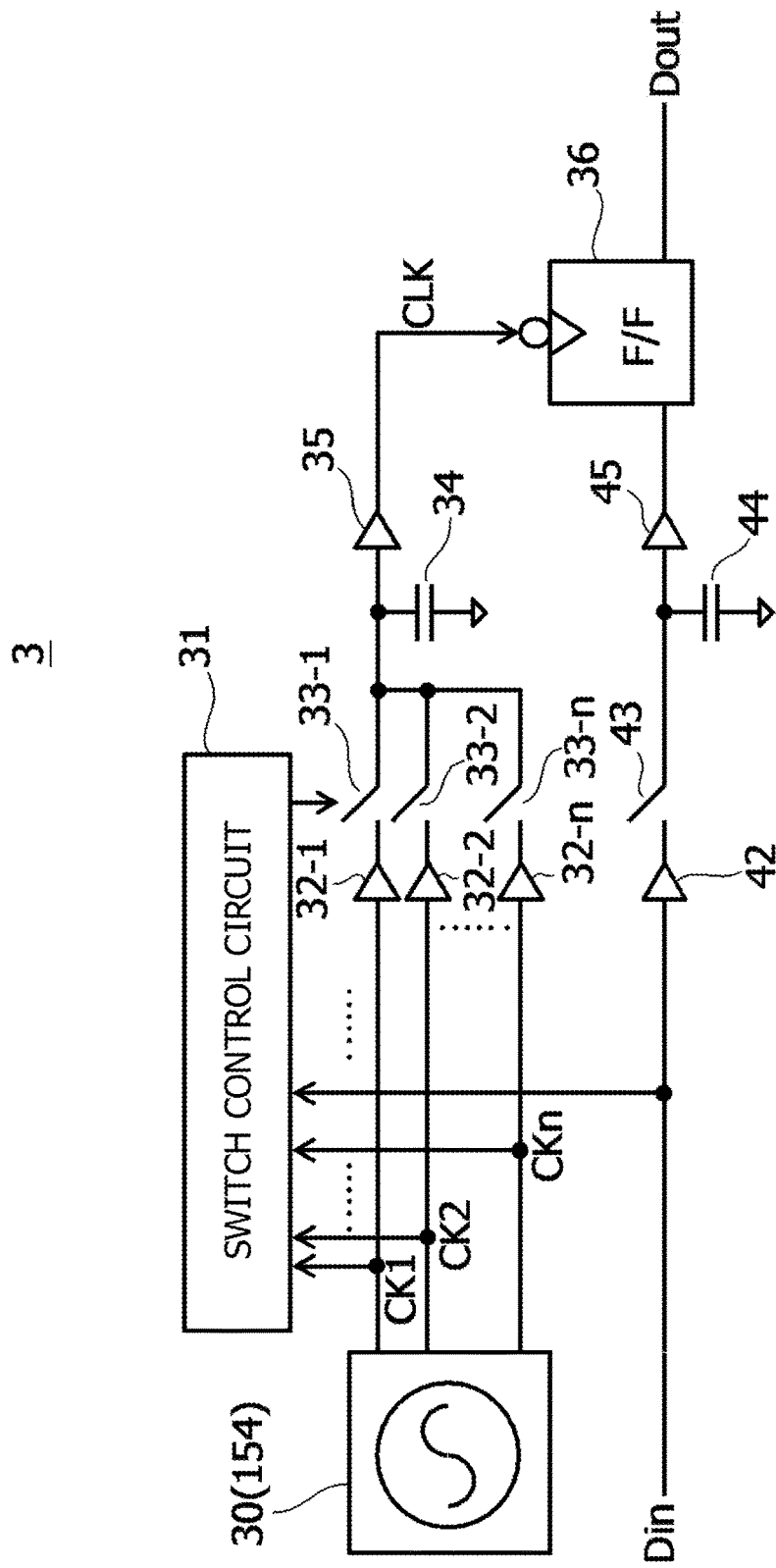
FIG. 9 illustrates one example of a clock recovery circuit.

FIG. 9 illustrates one example of a clock recovery circuit. The clock recovery circuit illustrated in FIG. 9 may be the clock recovery circuit 3 illustrated in FIG. 3. In FIG. 9, when compared with FIG. 8, not dummy buffers and switch elements in the number corresponding to the multi-phase clocks CK1 to CKn like the dummy buffers and switch elements illustrated in FIG. 8 but one buffer 42 and one switch element 43 are provided for the input data Din. For example, if the delay time due to the buffer is short, one dummy buffer 42 and one dummy switch element 43 may be provided for the input data Din as in FIG. 9.

Also in FIG. 9, the buffer 45 for waveform shaping corresponding to the buffer 35 that carries out waveform shaping for the recovered clock is provided for the input data Din and the capacitive element 44 corresponding to the capacitive element 34 for the clock is provided at a node N4. The numbers of dummy buffers (42) and dummy switch elements (43) provided for the input data Din are not limited to one and may be an adequate number. The dummy buffer (42) and the dummy switch element (43) may be unnecessary. For example, the numbers of dummy buffers and dummy switch elements provided for the input data Din may be set to a smaller number than the number of multi-phase clocks CK1 to CKn.

Figure 10:
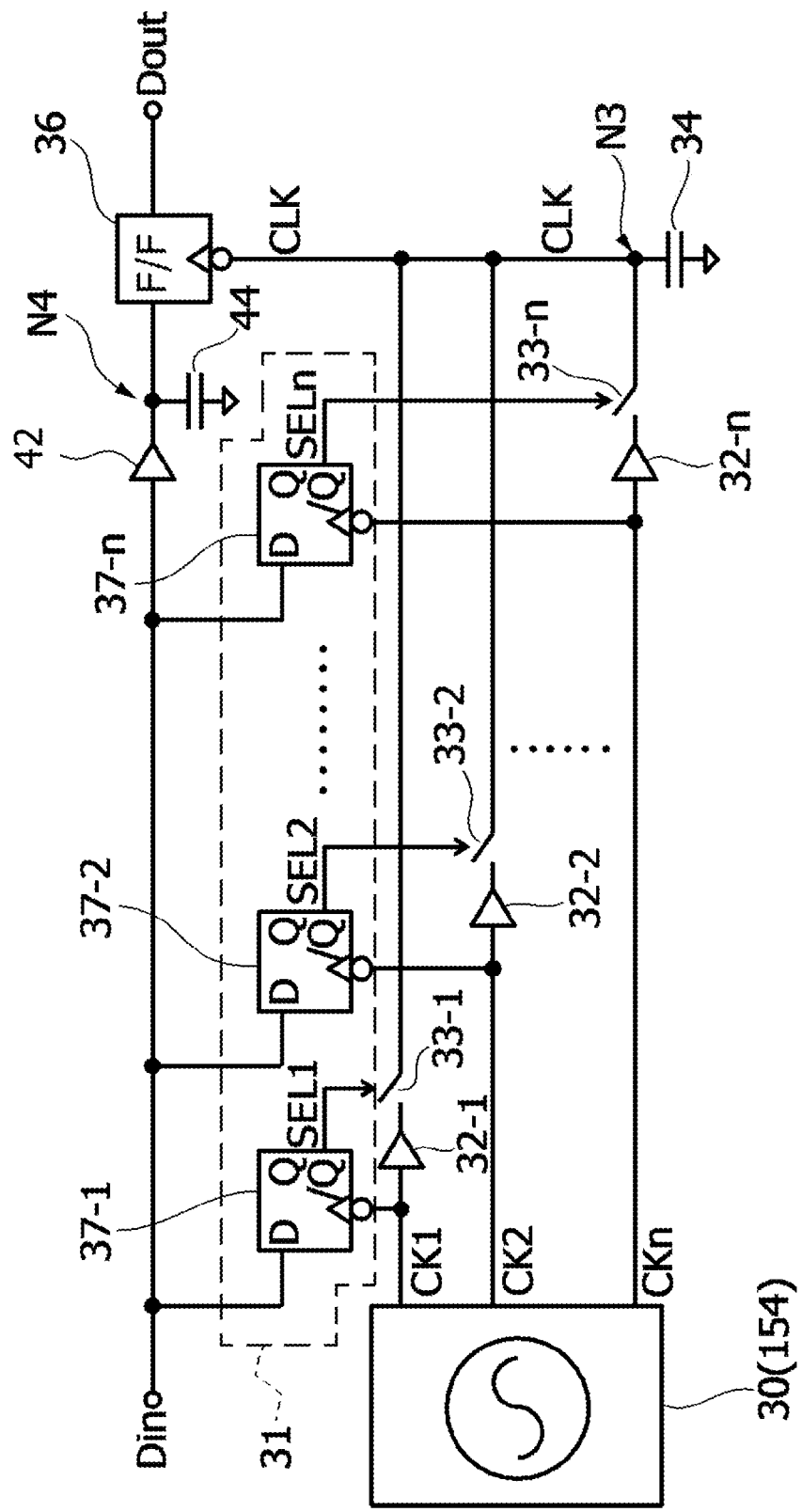
FIG. 10 illustrates one example of a clock recovery circuit.

FIG. 10 illustrates one example of a clock recovery circuit. The clock recovery circuit illustrated in FIG. 10 may be the clock recovery circuit illustrated in FIG. 9. In FIG. 10, one example of the switch control circuit 31 is illustrated in detail. In FIG. 10, the switch 43 for the input data Din in FIG. 9 and the buffers 35 and 45 for waveform shaping for the recovered clock (output clock CLK) and the input data Din are omitted.

As illustrated in FIG. 10, the switch control circuit 31 includes n flip-flops corresponding to the number of multi-phase clocks CK1 to CKn, for example, D flip-flops 37-1 to 37-n. The flip-flops, for example, the second flip-flops 37-1 to 37-n, receive the input data Din by data input terminals D and receive the multi-phase clocks CK1 to CKn by clock input terminals (clock input terminals of inverted logic) to output selection signals SEL1 to SELn of the switches.

Figure 11A:
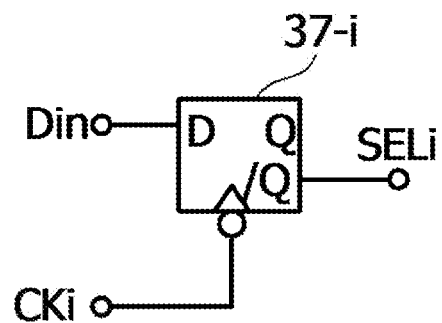
FIG. 11A and FIG. 11B illustrate one example of operation of a flip-flop of a switch control circuit.
Figure 11B:
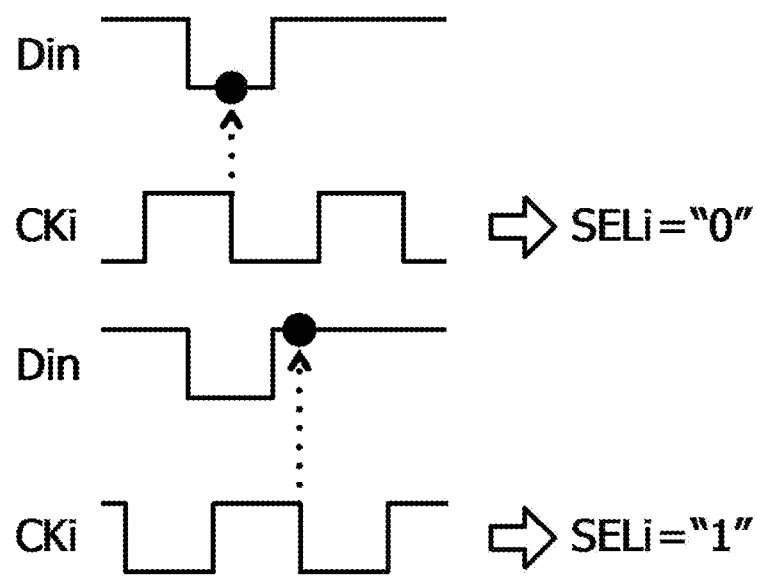

FIG. 11A and FIG. 11B illustrate one example of operation of a flip-flop of a switch control circuit. As illustrated in FIG. 11A and FIG. 11B, each flip-flop 37-i compares the phases of the input data Din and the corresponding clock CKi and takes in the input data Din at the falling edge of the clock CKi to output the input data Din as the selection signal SELi. The switch element 33i is formed of a p-type organic transistor, for example, and is turned on when the selection signal SELi is "0" and is turned off when the selection signal SELi is "1."

Plural switch elements 33i may be turned on when the selection signal SELi becomes "0" and plural clocks having different phases that have passed through the switch elements 33i in the on-state are short-circuited at one terminal of the capacitive element 34 (output node N3). The other terminal of the capacitive element 34 is grounded and the plural clocks having different phases that have passed through the switch elements 33*i* in the on-state are subjected to phase interpolation by the capacitive element 34 to be output as the recovered clock CLK. The recovered clock CLK is input to a clock input terminal, for example, e.g. a clock input terminal of inverted logic, of a flip-flop having a data input terminal to which the input data Din is input, for example, e.g. the first flip-flop 36, and output data Dout is output from the flip-flop 36.

Figure 12:
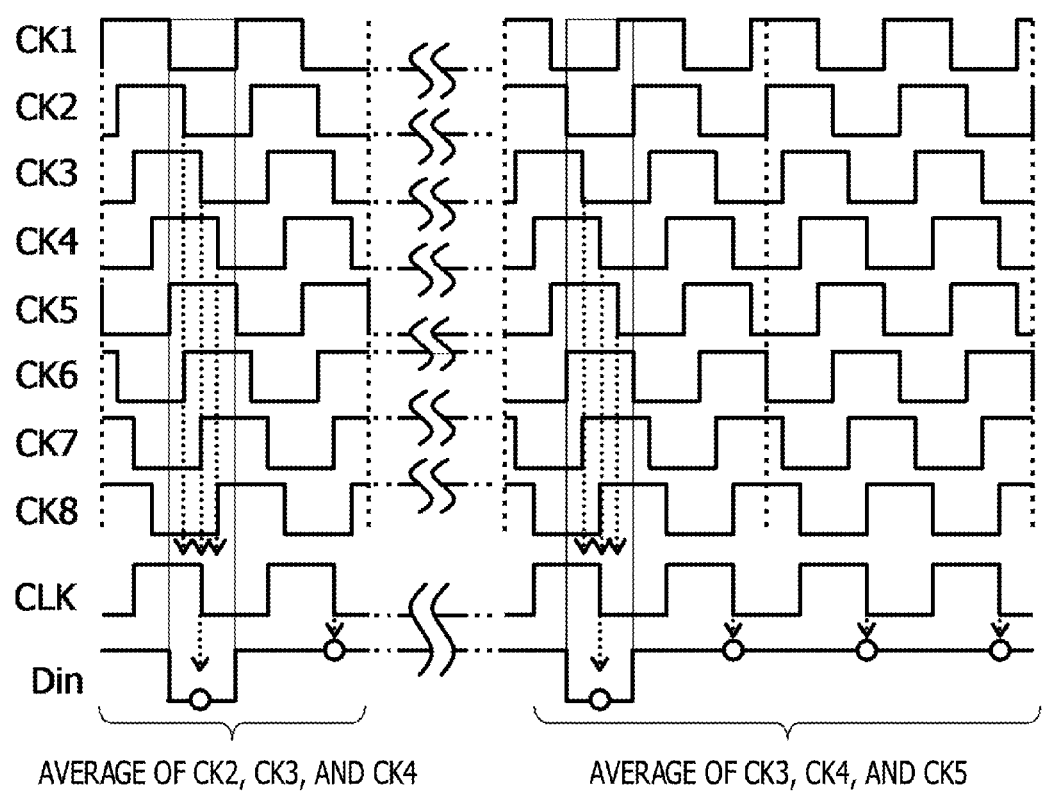
FIG. 12 illustrates one example of recovery operation of an output clock in a clock recovery circuit.

FIG. 12 illustrates one example of recovery operation (interpolation processing) of an output clock in a clock recovery circuit. The clock recovery circuit in FIG. 12 may be the clock recovery circuit illustrated in FIG. 10. In FIG. 12, the case in which eight-phase clocks whose phases are different from each other by 45° are applied as multi-phase clocks is represented. As described with FIG. 11A and FIG. 11B, each flip-flop 37-*i* compares the phases of the input data Din and the corresponding clock CKi and outputs the selection signal SELi of the switch element 33*i*.

In the left half of FIG. 12, for example, the case in which the selection signals SEL2, SEL3, and SEL4 become "0" and three switch elements 33-2, 33-3, and 33-4 are turned on is represented. For example, the case in which three clocks CK2, CK3, and CK4 are included in a pause period in the input data Din (case in which the phase differences between the three clocks CK2, CK3, and CK4 and the input data Din are within a given range) is represented. At this time, the three clocks CK2, CK3, and CK4 having different phases are short-circuited at the node N3 through the switch elements 33-2, 33-3, and 33-4 in the on-state and are subjected to phase interpolation (averaging) by the capacitive element 34. As a result, the clock CLK obtained by the phase interpolation (interpolated) with the three clocks CK2, CK3, and CK4 having different phases is output.

In the right half of FIG. 12, for example, the case in which the selection signals SEL3, SEL4, and SEL5 become "0" and three switch elements 33-3, 33-4, and 33-5 are turned on is represented. For example, the case in which three clocks CK3, CK4, and CK5 are included in a pause period in the input data Din (case in which the phase differences between the three clocks CK3, CK4, and CK5 and the input data Din are within a given range) is represented. At this time, the three clocks CK3, CK4, and CK5 having different phases are short-circuited at the node N3 through the switch elements 33-3, 33-4, and 33-5 in the on-state and are subjected to phase interpolation by the capacitive element 34. Thereby, the clock CLK obtained by the phase interpolation with the three clocks CK3, CK4, and CK5 having different phases is output. For example, the number of phases of the multi-phase clocks (the number of multi-phase clocks) is not limited to eight and the number of clocks subjected to phase interpolation also changes according to the number of multi-phase clocks and so forth.

Figure 13A:
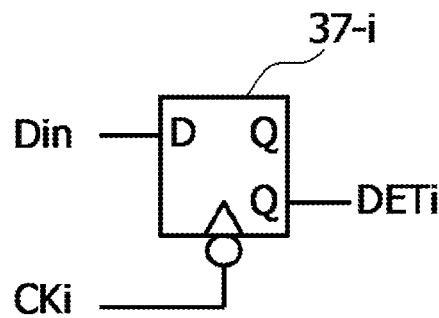
FIG. 13A and FIG. 13B illustrate one example of a clock recovery circuit.
Figure 13B:
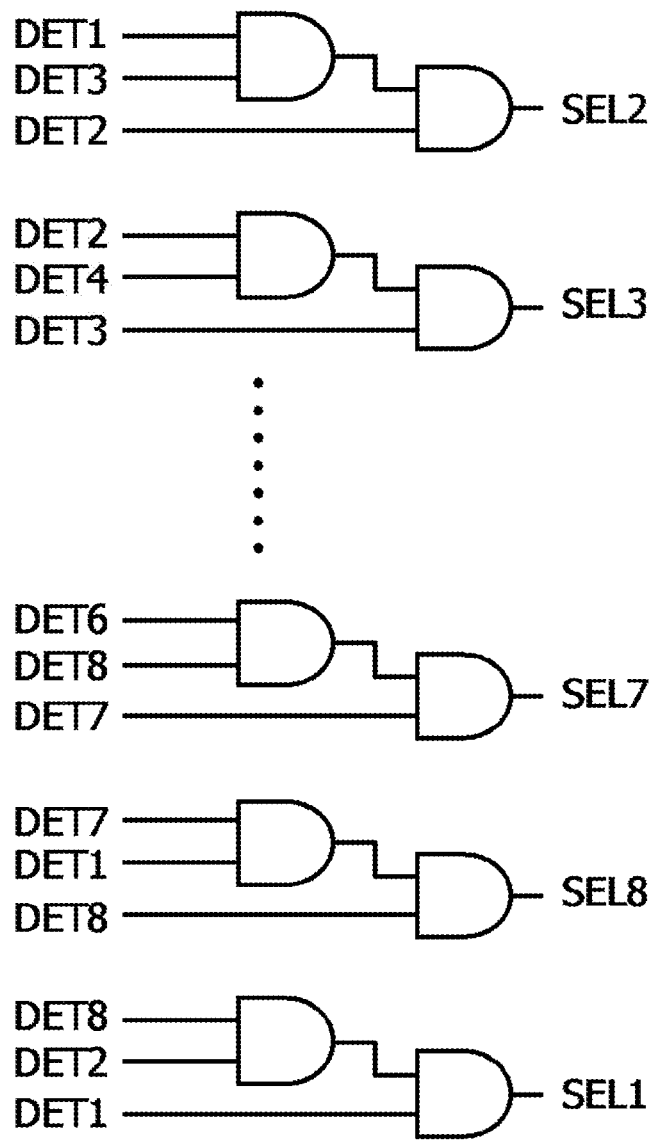

FIG. 13A and FIG. 13B illustrate one example of a clock recovery circuit. The clock recovery circuit illustrated in FIG. 13 may be the clock recovery circuit 3 illustrated in FIG. 3. For example, FIG. 13A may correspond to FIG. 11A. FIG. 13B illustrates a logic circuit that performs logical operation of outputs DETi (DET1 to DET8) of the respective flip-flops 37-*i* (37-1 to 37-8). In the clock recovery circuit illustrated in FIG. 13A and FIG. 13B, the switch elements (33-1 to 33-8) are not controlled directly by the outputs DET1 to DET8 of the respective flip-flops 37-*i* and the selection signals SELi (SEL1 to SEL8) are generated by performing logical operation of the outputs DET1 to DET8. For example, the coupling of the respective switch elements (33-1 to 33-8) is controlled by the selection signals SEL1 to SEL8 obtained by the logical processing (in FIG. 13B, logical conjunction processing) by the logic circuit. For example, the logic circuit based on plural AND gates illustrated in FIG. 13B may be one example and various logic gates such as a NOR gate may be applied.

Figure 14A:
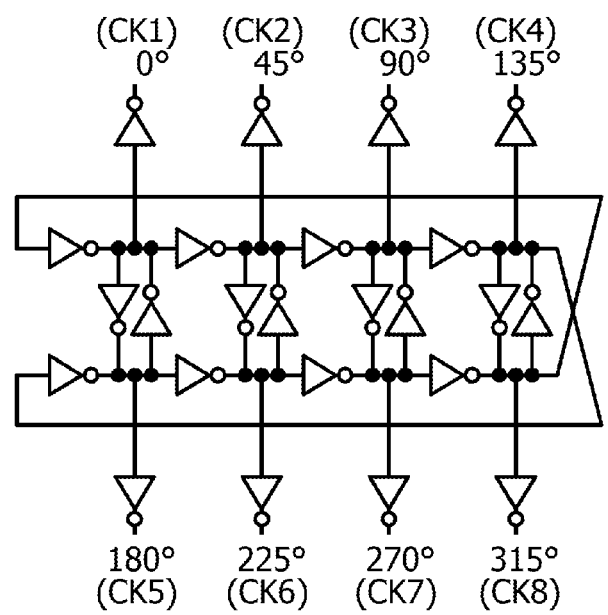
FIG. 14A and FIG. 14B illustrate one example of a multi-phase clock generating circuit.
Figure 14B:
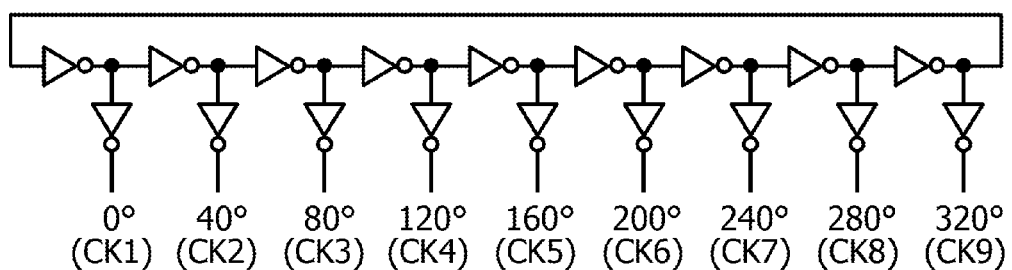

FIG. 14A and FIG. 14B illustrate one example of a multi-phase clock generating circuit. The multi-phase clock generating circuit illustrated in FIG. 14A and FIG. 14B may be the multi-phase clock generating circuit 30 illustrated in FIG. 8. In FIG. 14A, eight-phase clocks (CK1 to CK8 whose phases are different from each other by 45°) are generated. In FIG. 14B, nine-phase clocks (CK1 to CK9 whose phases are different from each other by 40°) are generated. If the multi-phase clock generating circuit 30 (154) is formed with an organic semiconductor (organic transistor), delay variation of each stage is large and therefore only outputs of nine stages in a 27-stage ring oscillator may be used, for example. For example, in the 27-stage ring oscillator, the clocks CK1 to CK9 of nine phases may be generated by using the output of every three stages.

Figure 15:
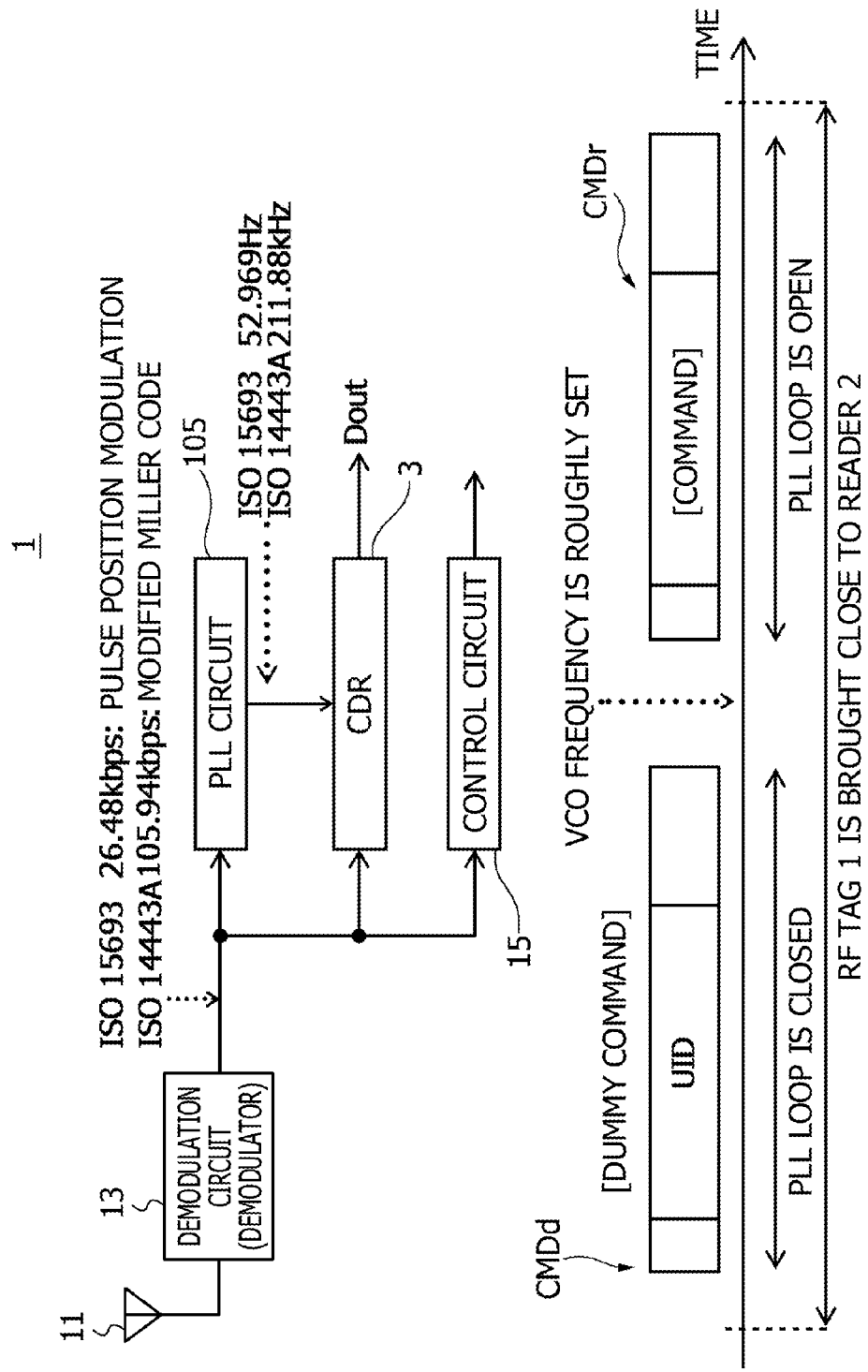
FIG. 15 illustrates one example of an RF tag in which a real-time clock generating circuit is not provided.
Figure 16:
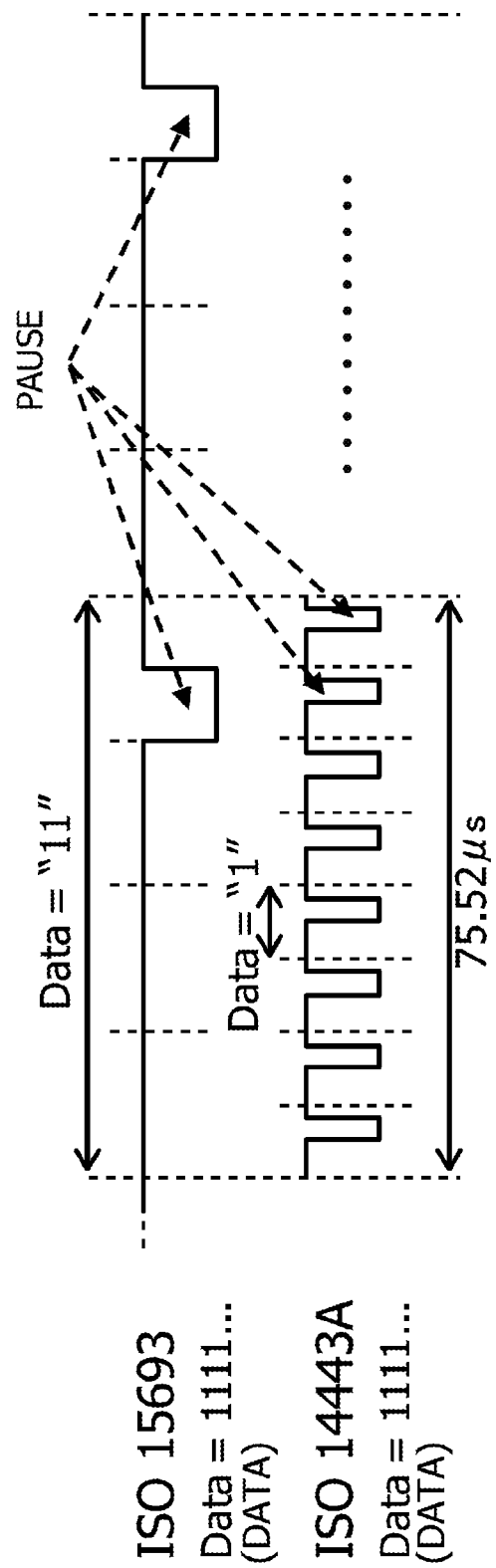
FIG. 16 illustrates one example of operation of an RF tag in which a real-time clock generating circuit is not provided.
Figure 17:
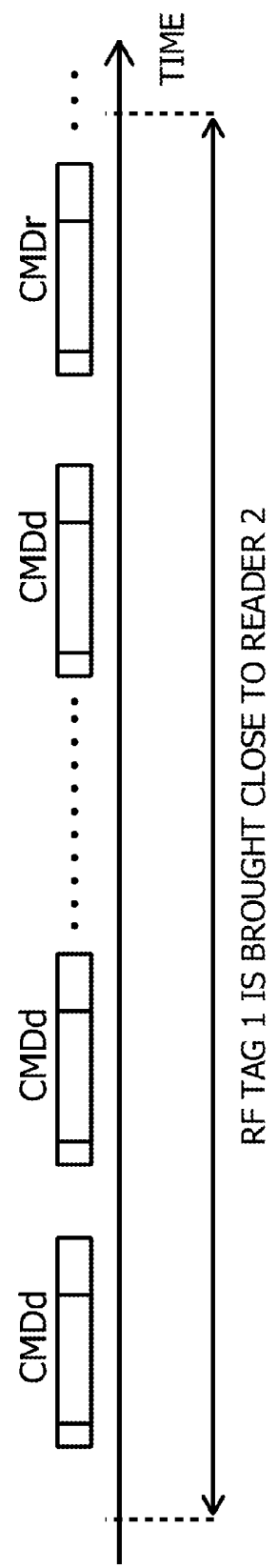
FIG. 17 illustrates one example of an operation of an RF tag in which a real-time clock generating circuit is not provided.

FIG. 15 to FIG. 17 illustrate one example of an RF tag in which a real-time clock generating circuit is not provided. In FIG. 15 to FIG. 17, a configuration in which the real-time clock generating circuit 1*c* is not provided in the RF tag 1 illustrated in FIG. 2 is illustrated. In the RF tag 1 in FIG. 2, for example, the short-distance radio communication circuit unit 1*b* operates by using the real-time clock (reference clock) RCK from the real-time clock generating circuit 1*c* that receives supply of power of the battery id and operates steadily.

For example, in the above-described RF tag (semiconductor integrated circuit device), the real-time clock generating circuit 1*c* is not provided and the reference clock (equivalent to the real-time clock) RCK used by the short-distance radio communication circuit unit 1*b* is generated from a dummy command. For example, in the state in which the RF tag 1 is brought close to the reader (for example, smartphone) 2, a dummy command CMDd previous to an actual command CMDr sent from the reader 2 is received, for example. In the dummy command CMDd, for example, a given pattern such as "01010101 . . . " is embedded as a user identifier (UID). The RF tag 1 generates the reference clock RCK from the given pattern embedded in this dummy command CMDd.

When the reference clock RCK is generated from the given pattern embedded in the dummy command CMDd, the loop of the PLL circuit may be closed and the frequency of the voltage-controlled oscillator (VCO) 30 may be roughly set (broadly adjusted), for example. Thereafter, for example, the processing described with FIG. 8 to FIG. 12 is executed, so that the output clock (recovered clock) CLK is generated and the output data Dout is output from the input data Din.

As illustrated in FIG. 16, for example, if the coding system of ISO 15693 is applied, a pattern in which a pause (9.44 microseconds) is inserted only one time in 75.52 microseconds is generated through sending of data in which "1" consecutively appears as in "111111 . . . " as the UID of the dummy command CMDd. For example, if the coding system of ISO 14443A (type A of ISO 14443) is applied, a pattern in which given pauses prescribed based on the standard are inserted is generated through sending of data in which "1" consecutively appears as in "111111 . . . " as the UID of the dummy command CMDd in a similar manner.

As illustrated in FIG. 17, the dummy command CMDd for generating the reference clock RCK may be sent plural times consecutively before the actual command CMDr. By sending the dummy command CMDd plural times in this manner, the accuracy of adjustment of the frequency by the PLL circuit 105 becomes higher and the time until reception of the actual command CMDr becomes longer. Due to generation of the reference clock RCK from the dummy command CMDd as above, power consumption by the real-time clock generating circuit 1c described with FIG. 2 might be reduced and further power saving might be carried out, for example.

The clock recovery circuit may be applied as the tag IC 10 (semiconductor integrated circuit device: RF tag) in the RFID system described with FIG. 1, for example. However, the clock recovery circuit is not limited to the application to the RFID system. The clock recovery circuit may be applied to an RF tag to which an organic semiconductor is applied, for example, and the applied transistor is also not limited to the organic semiconductor.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A clock recovery circuit comprising:
   a multi-phase clock generating circuit configured to generate multi-phase clocks having different phases;
   a plurality of switch elements configured to control coupling between each of the multi-phase clocks and a clock output node; and
   a switch control circuit configured to compare phases of the multi-phase clocks and input data and control at least two switch elements of the plurality of switch elements corresponding to at least two clocks whose phase difference falls within a given range in such a manner that the at least two switch elements become an on-state and the at least two clocks which output from the at least two switch elements couple to the clock output node,
   wherein the at least two clocks selected through the at least two switch elements controlled to the on-state are subjected to phase interpolation at the clock output node to recover an output clock.

2. The clock recovery circuit according to claim 1, further comprising:
   a data determining circuit configured to determine the input data based on the output clock and generate output data.

3. The clock recovery circuit according to claim 2, wherein the data determining circuit includes a first flip-flop that receives the input data by an input terminal and receives the output clock by a clock terminal.

4. The clock recovery circuit according to claim 2, wherein a capacitive element is provided at the clock output node, and the phase interpolation of the at least two clocks is carried out by the capacitive element to recover the output clock.

5. The clock recovery circuit according to claim 2, wherein each of the multi-phase clocks is input to the respective switch elements through respective buffers, and the data input is input to an input terminal of the data determining circuit through dummy buffers in a number corresponding to the buffers and dummy switch elements in a number corresponding to the switch elements.

6. The clock recovery circuit according to claim 5, wherein a capacitive element is provided at the clock output node, and a dummy capacitive element corresponding to the capacitive element is provided at an output of the dummy switch elements.

7. The clock recovery circuit according to claim 2, wherein each of the multi-phase clocks is input to the respective switch elements through respective buffers, and the data input is input to an input terminal of the data determining circuit through a smaller number of dummy buffers and a smaller number of dummy switch elements than a number of the multi-phase clocks.

8. The clock recovery circuit according to claim 1, wherein the switch control circuit includes a plurality of second flip-flops that each receives the input data by an input terminal and each receives a respective one of the multi-phase clocks by a clock terminal, and an output of each of the plurality of second flip-flops controls a coupling of the respective switch elements.

9. A semiconductor integrated circuit device comprising:
   a sensor main body circuit coupled to a battery; and
   a short-distance radio communication circuit including:
      a phase-locked loop circuit that receives a clock and generates multi-phase clocks having different phases; and
      a clock recovery circuit that receives the multi-phase clocks and generates an output clock,
   wherein the clock recovery circuit includes:
      a plurality of switch elements that control coupling between each of the multi-phase clocks and a clock output node; and
      a switch control circuit that compares phases of the multi-phase clocks and input data and controls at least two switch elements of the plurality of switch elements corresponding to at least two clocks whose phase difference falls within a given range in such a manner that the at least two switch elements become an on-state and the at least two clocks which output from the at least two switch elements couple to the clock output node, and the at least two clocks selected through the at least two switch elements controlled to the on-state are subjected to phase interpolation at the clock output node to recover an output clock.

10. The semiconductor integrated circuit device according to claim 9, further comprising:
    real-time clock generating circuit configured to be driven by the battery and generate a real-time clock to output the real-time clock as the clock.

11. The semiconductor integrated circuit device according to claim 10, wherein the real-time clock generating circuit is supplied with power of the battery also when the real-time clock generating circuit does not operate, and the sensor main body circuit is supplied with the power of the battery after a power-on signal from the short-distance radio communication circuit is input to the sensor main body circuit.

12. The semiconductor integrated circuit device according to claim 9, wherein the clock is generated from a dummy command in which a given pattern is embedded.

13. The semiconductor integrated circuit device according to claim 12, wherein the dummy command is transmitted before an actual command.

14. The semiconductor integrated circuit device according to claim 9, wherein the sensor main body circuit includes a silicon semiconductor, and the short-distance radio communication circuit includes an organic semiconductor.

15. The semiconductor integrated circuit device according to claim 9, wherein the multi-phase clocks are generated by a voltage-controlled oscillator in the phase-locked loop circuit.

16. A radio frequency tag comprising:
a semiconductor integrated circuit device including:
a sensor main body circuit coupled to a battery; and
a short-distance radio communication circuit including:
   a phase-locked loop circuit that receives a clock and generates multi-phase clocks having different phases; and
   a clock recovery circuit that receives the multi-phase clocks and generates an output clock; and
   an antenna configured to exchange a signal with a reader-writer,
wherein the clock recovery circuit includes:
a plurality of switch elements that control coupling between each of the multi-phase clocks and a clock output node; and
a switch control circuit that compares phases of the multi-phase clocks and input data and controls at least two switch elements of the plurality of switch elements corresponding to at least two clocks whose phase difference falls within a given range in such a manner that the at least two switch elements become an on-state and the at least two clocks which output from the at least two switch elements couple to the clock output node, and the at least two clocks selected through the at least two switch elements controlled to the on-state are subjected to phase interpolation at the clock output node to recover an output clock.

* * * * *